US009929206B2

(12) United States Patent
Vereecke et al.

(10) Patent No.: US 9,929,206 B2
(45) Date of Patent: Mar. 27, 2018

(54) INTEGRATED CIRCUIT AND METHOD FOR MANUFACTURING INTEGRATED CIRCUIT

(71) Applicant: IMEC VZW, Leuven (BE)

(72) Inventors: Bart Vereecke, Heverlee (BE); Deniz Sabuncuoglu Tezcan, Landen (BE); Philippe Soussan, Wavre (BE); Nicolaas Tack, Buggenhout (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/191,412

(22) Filed: Jun. 23, 2016

(65) Prior Publication Data

US 2017/0005132 A1 Jan. 5, 2017

(30) Foreign Application Priority Data

Jun. 30, 2015 (EP) .................................... 15174534

(51) Int. Cl.
*H01L 27/32* (2006.01)
*H01L 27/146* (2006.01)
(Continued)

(52) U.S. Cl.
CPC ...... *H01L 27/14685* (2013.01); *G01J 3/0259* (2013.01); *G01J 3/50* (2013.01);
(Continued)

(58) Field of Classification Search
CPC ........... H01L 27/1461; H01L 27/14623; H01L 27/14625; H01L 27/14629; H01L 27/14643
See application file for complete search history.

(56) References Cited

U.S. PATENT DOCUMENTS 5,373,182 A 12/1994 Norton
2006/0169878 A1* 8/2006 Kasano ............. H01L 27/14625 250/226

(Continued)

FOREIGN PATENT DOCUMENTS

EP 2 693 242 A2 2/2014
WO WO 2008/134574 A1 11/2008

OTHER PUBLICATIONS

Extended European Search Report dated Dec. 10, 2015 for European Application No. 15174534.6 which corresponds in priority to the above identified subject U.S. application.

*Primary Examiner* — Cuong Q Nguyen
(74) *Attorney, Agent, or Firm* — Knobbe, Martens, Olson & Bear LLP

(57) ABSTRACT

An integrated circuit for an imaging device including an array of photo-sensitive areas is disclosed. In one aspect the integrated circuit includes a first multi-layer structure and a second multi-layer structure arranged over a first and a second photo-sensitive area, respectively. The second multi-layer structures each have a bottom and a top reflective structure and a spacer layer arranged therebetween. The spacer layer has a thickness such that the multi-layer structure selectively transmits a narrow range of wavelengths of electro-magnetic radiation. The bottom and top reflective structures include a stack of alternating layers of a first and a second material. Thickness and/or material of the alternating layers of the first multi-layer structure differ from thickness and/or material of the alternating layers of the second multi-layer structure.

20 Claims, 12 Drawing Sheets

10
14
22
26
20
20b
20a
28
18
16
16b
24
24b
16a
24a
12a 12b 12c 12d 12e 12f 12g

(51) Int. Cl.

| | |
|---|---|
| ***G01J 3/51*** | (2006.01) |
| ***G01J 3/50*** | (2006.01) |
| ***G01J 3/02*** | (2006.01) |
| *G01J 3/12* | (2006.01) |

(52) U.S. Cl.

CPC .......... *G01J 3/513* (2013.01); *H01L 27/1461* (2013.01); *H01L 27/14623* (2013.01); *H01L 27/14625* (2013.01); *H01L 27/14629* (2013.01); *H01L 27/14643* (2013.01); *G01J 2003/1226* (2013.01)

(56) References Cited

U.S. PATENT DOCUMENTS

| | | | |
|---|---|---|---|
| 2008/0042782 | A1 | 2/2008 | Wang et al. |
| 2009/0225204 | A1 | 9/2009 | Inaba et al. |
| 2011/0049340 | A1 | 3/2011 | Tisserand et al. |
| 2011/0181757 | A1 | 7/2011 | Fish et al. |
| 2014/0034835 | A1 | 2/2014 | Frey et al. |

* cited by examiner

INTEGRATED CIRCUIT AND METHOD FOR MANUFACTURING INTEGRATED CIRCUIT

RELATED APPLICATIONS

This application claims priority to European Application EP 15174534.6, entitled "INTEGRATED CIRCUIT AND METHOD FOR MANUFACTURING INTEGRATED CIRCUIT," filed on Jun. 30, 2015, and incorporated herein by reference in its entirety.

BACKGROUND

Field

The disclosed technology relates to an integrated circuit and a method of manufacturing the integrated circuit. In particular, the integrated circuit includes photo-sensitive areas for acquiring an image and filters for selectively transmitting different wavelengths of electro-magnetic radiation to different photo-sensitive areas.

Description of the Related Technology

Many applications require acquisition of spectral images of an object. Spectral imaging implies that the spectral content of an image of the object is extracted and incident electro-magnetic radiation relating to multiple narrow ranges of wavelengths is detected. The spectral imaging may for instance be used in analysis of imaged objects, such as for determination whether a substance having a specific spectral profile is present in the object.

Multispectral imaging refers to spectral imaging using a plurality of discrete wavelength bands, whereas hyperspectral imaging refers to imaging narrow spectral wavelength bands over a continuous spectral range. Hyperspectral imaging may also often use a larger number of spectral bands than what is used in multispectral imaging.

It is commonly desired that spectral imaging is performed for each part of an object. Thus, image data may need to be gathered in three dimensions, two spatial dimensions combined with a spectral dimension. This implies that large amounts of image data need to be gathered and sets requirements on an imaging device for gathering the image data.

US PG Publication No. 2011/0181757 discloses an apparatus for multispectral imaging. The apparatus includes a monochromatic two-dimensional image sensor and an optical filter wheel arranged in front of the image sensor. The filter wheel consists of multiple filter segments and may be moved so different filter segments are arranged in a light path. Thus, different frames captured by the image sensor may hold different spectral information. However, such an apparatus is bulky and requires movable parts for obtaining image data in three dimensions.

US PG Publication No. 2011/0049340 discloses a substrate having detector cells that detect radiation incident thereon and a filter module providing multiple filters that are each aligned with a detector cell. The filter module is made up of two mirrors that are spaced apart by a spacer membrane and the filter module further has a plurality of interference filters, the thickness of the spacer membrane being constant for any filter and varying from one filter to another. Radiation is reflected multiple times in the mirrors at each side of the spacer membrane, and multiple rays at an output of the filter cause interference depending on a phase shift introduced in the spacer membrane. The many interfering rays lead to a selective optical filter. Thus, the device allows for gathering spectral image data for a large number of different wavelength bands by the thickness of the spacer membrane being different for different detector cells. However, the mirror material may have a relatively high absorption coefficient, which implies that a mirror layer needs to be thin. Simultaneously, the mirror layer needs to be sufficiently thick in order to achieve the desired reflectivity.

US PG Publication No. 2008/0042782 discloses an integrated narrow bandpass filter array. The filter array includes a substrate, a lower mirror stack, a spacer array, and an upper mirror stack. The spacer array is an array of varied thickness and is used to control a pass band for each narrow bandpass filter and realizes the integration of narrow bandpass filters with different pass bands on a single substrate. The mirror stacks are formed by alternating layers of high and low refractive index, respectively.

It is difficult to design a multitude of combined filters that provide a possibility of gathering image data holding spectral information for a broad spectrum of wavelengths. In particular, the filters may absorb large proportions of the electro-magnetic radiation, which implies that spectral imaging may only work in conditions having large intensities of electro-magnetic radiation. Also, or alternatively, the mirrors at each side of a spacer may only partially reflect electro-magnetic radiation in portions of a broad spectrum of wavelengths. This implies that electro-magnetic radiation within such portions of the spectrum of wavelengths may instead be transmitted towards the detector such that the filter is not satisfactorily providing narrow bandpass filters over the entire range of the broad spectrum.

SUMMARY OF CERTAIN INVENTIVE ASPECTS

It is therefore an objective of at least some aspects of the disclosed technology to provide a device which is suitable for spectral imaging allowing spectral information to be gathered for a broad spectrum of wavelengths of electro-magnetic radiation. In some aspects, it is a particular objective to provide an integrated circuit for an imaging device enabling the spectral imaging to be performed by means of a compact circuitry.

One aspect of the disclosed technology is an integrated circuit for an imaging device. The integrated circuit includes an array of photo-sensitive areas forming pixels. The integrated circuit further includes a first multi-layer structure and a second multi-layer structure. The first structure is arranged over a first photo-sensitive area of the array and the second structure is arranged over a second photo-sensitive area of the array. The first and the second multi-layer structure each have a bottom reflective structure, a top reflective structure and a spacer layer arranged between the bottom and top reflective structures. The spacer layer has a thickness which is adapted so that the first and the second multi-layer structures, respectively, selectively transmit a narrow range of wavelengths of electro-magnetic radiation. At least one of the bottom and top reflective structures include a stack of alternating layers of a first and a second material for forming a reflective structure. Thickness and/or material of the alternating layers of the at least one of the bottom and top reflective structures of the first multi-layer structure differ from thickness and/or material of the alternating layers of the at least one of the bottom and top reflective structures of the second multi-layer structure.

Another aspect of the disclosed technology is a method for manufacturing an integrated circuit for an imaging device. The method includes forming a first multi-layer structure on a substrate, on which an array of photo-sensitive areas is arranged. The first multi-layer structure is formed in a first region over a first photo-sensitive area of the array.

The first multi-layer structure includes a bottom reflective structure, a top reflective structure and a spacer layer arranged between the bottom and top reflective structures. The spacer layer has a thickness which is adapted so that the first multi-layer structure selectively transmits a narrow range of wavelengths of electro-magnetic radiation. At least one of the bottom and top reflective structures includes a stack of alternating layers of a first and a second material for forming a reflective structure. The method further includes forming a second multi-layer structure in a second region over a second photo-sensitive area of the array. The second multi-layer structure includes a bottom reflective structure, a top reflective structure and a spacer layer arranged between the bottom and top reflective structures. The spacer layer has a thickness which is adapted so that the second multi-layer structure selectively transmits a narrow range of wavelengths of electro-magnetic radiation. At least one of the bottom and top reflective structures includes a stack of alternating layers of a first and a second material for forming a reflective structure. Thickness and/or material of the alternating layers of the at least one of the bottom and top reflective structures of the first multi-layer structure differ from thickness and/or material of the alternating layers of the at least one of the bottom and top reflective structures of the second multi-layer structure.

The alternating layers of different materials of the at least one of the bottom and top reflective structures may provide that the reflective structure is highly reflective over a broad range of wavelengths of electro-magnetic radiation. The materials may be selected to have a low absorption within this range of wavelengths so that the electro-magnetic radiation is not absorbed in the reflective structure instead of reaching the photo-sensitive area below.

The top and bottom reflective structures within each of the multi-layer structures may be formed from the same first and second materials and having alternating layers of the same thickness. However, it should be realized that the top and bottom reflective structures may differ, e.g. by means of having different numbers of alternating layers. Also, it should be realized that within the top and bottom reflective structures, the thickness of layers of same material may differ.

The top and bottom reflective structures may thus provide reflective layers on each side of the spacer layer, such that the refractive index and thickness of the spacer layer may control a narrow range of wavelengths of electro-magnetic radiation which will be allowed to pass the multi-layer structure. Such a multi-layer structure is often called a Fabry-Pérot filter.

The disclosed technology is at least partly based on an insight that, when a broad spectrum of wavelengths of electro-magnetic radiation is to be detected in spectral imaging, it is very difficult, or even impossible, to find materials allowing adequate filtering. The reflective surfaces may not be good reflectors over the entire broad spectrum of wavelengths. Thus, instead of reflecting electro-magnetic radiation to provide constructive interference for a narrow range of wavelengths, the reflective surfaces transmit electro-magnetic radiation of portions of the spectrum of wavelengths. This transmitted radiation of undesired wavelengths may reach the photo-sensitive areas and interfere with the detection of electro-magnetic radiation of the selected wavelengths. Thus, according to the disclosed technology, rather than trying to find materials that would allow satisfactory filtering of wavelengths of electro-magnetic radiation over a desired spectrum, at least two multi-layer structures are provided, wherein different materials and/or thickness of alternating layers of the bottom and/or top reflective structures are used. This implies that materials and/or thickness of the alternating layers may be chosen so as to fit to different spectra of wavelengths. Hence, the first and second multi-layer structures may be arranged over different photo-sensitive areas in order to together allow a broader range of the wavelength spectrum to be detected in the imaging device.

In particular, the materials used for forming the first and second multi-layer structures may be compatible with a semiconductor manufacturing process. This implies that the first and second multi-layer structures may be formed on the photo-sensitive areas of the integrated circuit during the manufacturing of the integrated circuit. Also, further processing of the integrated circuit may be performed after the multi-layer structures have been formed on the integrated circuit. For instance, the materials of the first and second multi-layer structures may be able to withstand deposit, lithography or etching steps in later processing of the integrated circuit. Thus, for instance, interconnections may be formed in the integrated circuit after the first and second multi-layer structures have been formed.

Further, with materials compatible with a semiconductor manufacturing process, the first and second multi-layer structures may be formed by a sequence of depositing and removal steps. This implies that the first and second multi-layer structures may be formed with precision and it may be especially advantageous where the first and second multi-layer structures are interleaved or arranged in an alternating manner on the integrated circuit.

The disclosed technology allows forming a first and second multi-layer structure for providing wavelength filters over a broad spectrum on a common imaging device. This may be particularly useful with an imaging device based on semiconductor technology, such as an imaging device formed as a complementary metal-oxide-semiconductor (CMOS).

According to an embodiment, one of the first and second materials has a relatively low refractive index and another of the first and second materials has a relatively high refractive index. This should be construed as the one of the first and second materials having at least a lower refractive index than the other of the first and second materials. However, in order for the stack of layers of the first and second materials to be reflective over a broad range of wavelengths, there should be a large difference between the refractive indices of the first and second materials.

According to an embodiment of the integrated circuit, the first multi-layer structure is arranged over a plurality of photo-sensitive areas of the array and wherein a thickness of the spacer layer of the first multi-layer structure is different over different photo-sensitive areas of the plurality of photo-sensitive areas.

According to an embodiment of the method, the first multi-layer structure is formed over a plurality of photo-sensitive areas of the array, wherein said forming of the spacer layer of the first multi-layer structure includes selectively depositing and/or removing the spacer layer in different portions of the first multi-layer structure over different photo-sensitive areas such that the thickness of the spacer layer in the first multi-layer structure is different over different photo-sensitive areas of the plurality of photo-sensitive areas.

The materials and thicknesses of the alternating layers of the first multi-layer structure may provide appropriate optical characteristics (high reflectivity and low absorbance) for a range of wavelengths. The first multi-layer structure may thus form a plurality of filters within this range of wavelengths by means of the thickness of the spacer layer being varied. The plurality of filters may be aligned with different photo-sensitive areas such that different pixels will detect different wavelengths. In forming of the spacer layer, deposition and/or removal of the material forming the layer may be controlled carefully in order to act selectively on different portions of the first multi-layer structure such that different thicknesses of the spacer layer are formed in different portions. It should be realized that the second multi-layer structure may similarly be arranged over a plurality of photo-sensitive areas of the array with the thickness of the spacer layer of the second multi-layer structure being different over different photo-sensitive areas.

According to an embodiment of the integrated circuit, a first wavelength-rejecting filter is arranged over the first multi-layer structure and a second wavelength-rejecting filter is arranged over the second multi-layer structure to prevent undesired wavelengths of electro-magnetic radiation to reach the photo-sensitive areas. As discussed above, the reflective surfaces may not be good reflectors over an entire broad range of wavelengths. Rather, some undesired wavelengths may be transmitted towards the photo-sensitive areas. Also, the spacer layers may be arranged to transmit several orders of wavelengths, which also implies that electro-magnetic radiation of an undesired wavelength may be received by the photo-sensitive area and may affect an acquired image. Therefore, the wavelength-rejecting filter may ensure that only wavelengths within a partial spectrum that is properly handled by the multi-layer structure will be passed to the multi-layer structure. Since the first and second multi-layer structures may be adapted to transmit different wavelengths to the photo-sensitive areas, different wavelength-rejecting filters may be arranged over the first and second multi-layer structures, respectively.

According to an embodiment of the integrated circuit, the first multi-layer structure and the second multi-layer structure have been produced by depositing at least the bottom reflective structure of the first multi-layer structure over the first photo-sensitive area, depositing a cap layer on the at least bottom reflective structure of the first multi-layer structure, depositing at least the bottom reflective structure of the second multi-layer structure over the second photo-sensitive area and on top of the at least bottom reflective structure of the first multi-layer structure over the first photo-sensitive area and selectively removing the at least bottom reflective structure of the second structure from over the first photo-sensitive area.

According to an embodiment of the method, forming said first multi-layer structure and forming said second multi-layer structure includes: depositing at least the bottom reflective structure of the first multi-layer structure over the first photo-sensitive area; depositing a cap layer on the at least bottom reflective structure of the first multi-layer structure, depositing at least the bottom reflective structure of the second multi-layer structure over the second photo-sensitive area and on top of the at least bottom reflective structure of the first multi-layer structure over the first photo-sensitive area; and selectively removing the at least bottom reflective structure of the second structure from over the first photo-sensitive area.

Thanks to the depositing of a cap layer on the first multi-layer structure, the second multi-layer structure may be deposited on the substrate without the use of any masking during the deposit. The second multi-layer structure may be selectively removed from over the first photo-sensitive area, wherein the cap layer may facilitate selective removal. The cap layer may form a stop to an etching process so as to prevent the etching from affecting the previously deposited first multi-layer structure. According to an alternative, the cap layer may be used as a sacrificial layer which is lifted off together with the structure on top of the cap layer in a washing process.

The depositing of the first and second multi-layer structures may be performed in several consecutive steps, such that the bottom reflective structures of both the first and second multi-layer structures are formed before the spacer layers and top reflective structures are formed.

However, according to an embodiment, the bottom reflective structure, the spacer layer and the top reflective structure of the first multi-layer structure are first deposited over the first photo-sensitive area before said depositing of the cap layer. Thus, the entire first multi-layer structure is first formed, before the cap layer is deposited and the entire second multi-layer structure may be deposited.

According to an embodiment of the integrated circuit, the stack of the first multi-layer structure and the stack of the second multi-layer structure includes the same first and second materials; wherein layers of the second material in the stack of the first multi-layer structure is of a different thickness than layers of the second material in the stack of the second multi-layer structure.

This embodiment is based on a realization that by means of having a different thickness of the second material, the first and second multi-layer structures may be suited for passing different ranges of wavelengths to the photo-sensitive areas. Using the same first and second materials enables the alternating layers of the stacks of the first and second multi-layer structures to be formed layer by layer over both the first and second photo-sensitive area. Thus, the first and second multi-layer structures may be formed in parallel with each other. This also implies that there is not a need to remove multiple layered structures in removing steps and, therefore, the first and second multi-layer structures may be formed very close to each other. In fact, the first and second multi-layer structures may be formed over adjacent pixels.

According to a further embodiment of the integrated circuit, layers of the first material in the stack of the first multi-layer structure has the same thickness as layers of the first material in the stack of the second multi-layer structure.

Thus, the stacks of the first and second multi-layer structures differ only in the thickness of the second material. This implies that stacks of the first and second multi-layer structures may be formed in parallel, while only requiring that layers of the second material are controlled to have a different thickness in the first and second multi-layer structures, respectively.

According to an embodiment of the method, forming said first multi-layer structure and forming said second multi-layer structure includes: depositing a first material on the substrate, wherein the first material is deposited in the first region and in the second region and the second photo-sensitive area is adjacent to the first photo-sensitive area in the array; depositing a second material on the first material and selectively removing the second material in the first region, whereby the second layer in the first region has a different thickness to the second layer in the second region; repeating the depositing of the first material and the depositing and selective removing of the second material, such that a bottom reflective structure of the first multi-layer structure is formed in the first region and a bottom reflective structure of the second multi-layer structure is formed in the second region.

Thanks to this embodiment of the method, the first and second multi-layer structures may be formed in parallel layer by layer, which implies that the first and second multi-layer structures may be arranged close to each other, as discussed above.

According to an embodiment of the method, said selective removing of the second material selectively removes the full thickness of the deposited second material in the first or the second region and wherein said method further includes a second deposition of the second material after the selective removing.

Thanks to this method, the second material is completely removed from one of the first or the second regions, which implies that the thickness of the second material in this region is determined by the second deposition of the second material. Thus, the thickness of layers of the second material can be very closely controlled for both the first and the second regions as the thickness will be determined by depositing actions. In one of the first and second regions, the thickness of layers of the second material will equal the thickness deposited in the second deposition, while in the other of the first and second regions, the thickness of layers of the second material will equal the sum of thickness deposited in the first and second deposition of the second material.

According to an embodiment of the method, a third multi-layer structure is formed in a third region over a third photo-sensitive area of the array; wherein the first material is deposited also in the third region; said method further includes depositing an intermediate layer of the second material in the first, second, and third region; selectively removing the second material from the first and second regions; and depositing the first material in the first, second, and third region.

Thanks to this method, three different multi-layer structures may be formed, wherein the reflective structures of the three multi-layer structures use the same first and second materials but each have different combinations of the thicknesses of the layers of the first and/or second materials, such that the three different regions may be adapted to pass wavelengths of three different ranges to the photo-sensitive areas of the array. Further, the three multi-layer structures may be formed layer by layer in parallel, which implies that the multi-layer structures may be arranged close to each other.

According to the method for forming first, second and third multi-layer structures, the intermediate layer of the second material will be maintained in the third multi-layer structure when the first material is deposited again. This implies that the third multi-layer structure will include double numbers of layers in comparison to the first and second multi-layer structures.

According to a further embodiment of the method, the depositing of one intermediate layer is controlled to form a spacer layer in the third multi-layer structure.

The intermediate layer is only maintained in the third multi-layer structure. Thus, in one repetition of forming the stacked multi-layer structures, the intermediate layer may be formed from a different material, suitable for forming the spacer layer. In this way, the spacer layer may be formed in the third multi-layer structure while a stack of layers of first and second material is being formed in the three multi-layer structures. Since the third multi-layer structure includes double numbers of layers in the stack, this may be suitably done during the forming of the bottom reflective structure in the first, second and third multi-layer structures. Thus, while the bottom reflective structures are formed in the first and second multi-layer structures, the bottom reflective structure, the spacer layer and the top reflective structure of the third multi-layer structure is formed.

It should be realized that the spacer layer of any of the first, second and third multi-layer structures may be formed as an intermediate layer which is deposited on one of the multi-layer structures and removed from the other multi-layer structures.

BRIEF DESCRIPTION OF THE DRAWINGS

The above, as well as additional objectives, features and advantages of the present inventive concept, will be better understood through the following illustrative and non-limiting detailed description of preferred embodiments of the disclosed technology, with reference to the appended drawings. In the drawings like reference numerals will be used for like elements unless stated otherwise.

DETAILED DESCRIPTION OF CERTAIN EMBODIMENTS

Detailed embodiments of the disclosed technology will now be described with reference to the drawings.

Figure 1:
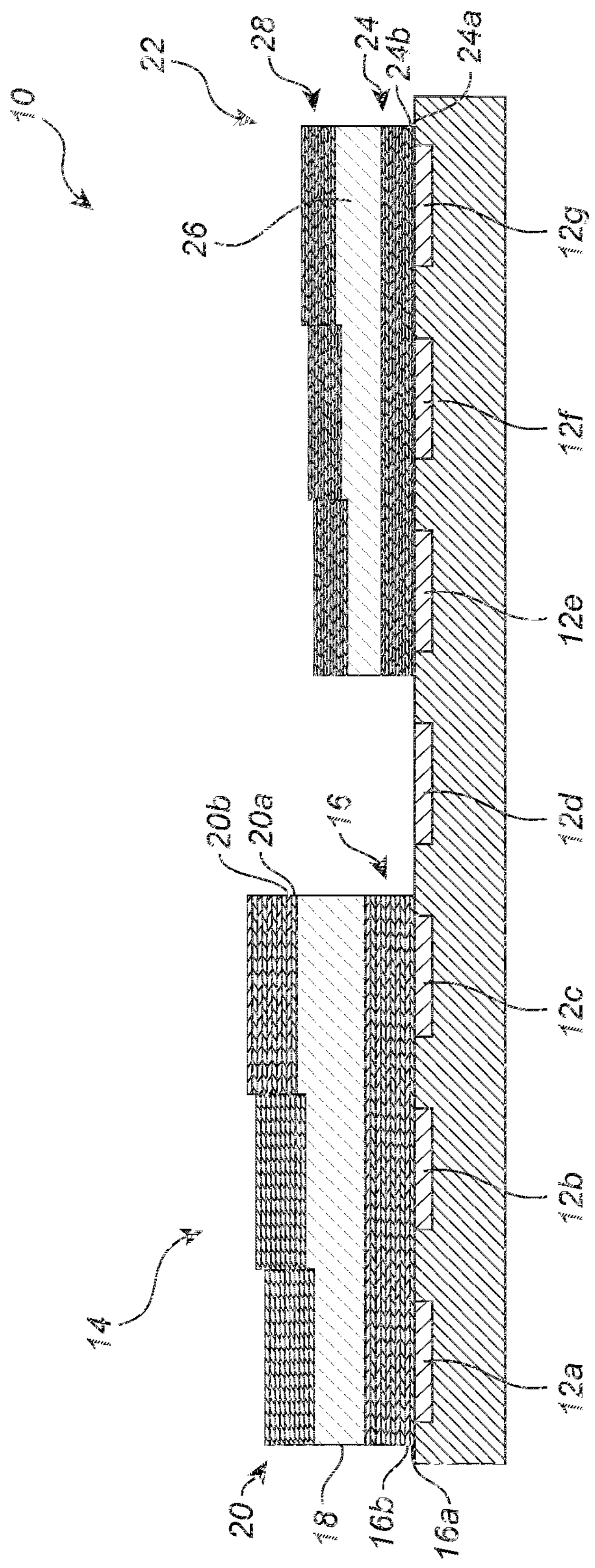
FIG. 1 is a schematic cross-sectional view of an integrated circuit according to a first embodiment of the disclosed technology.

Reference is made to FIG. 1, in which a cross-section of an integrated circuit 10 is schematically shown. The integrated circuit 10 is intended to be used for an imaging device and has photo-sensitive areas 12 (individually labeled 12*a*, 12*b*, 12*c*, 12*d*, 12*e*, 12*f* and 12*g*), which are arranged to detect intensity of electro-magnetic radiation incident on the photo-sensitive area 12. Each photo-sensitive area 12 may form a pixel and an array of photo-sensitive areas 12 may be arranged in the integrated circuit 10 such that the array of photo-sensitive areas 12 may detect the intensity of electro-magnetic radiation incident on each of the photo-sensitive areas 12 and thereby form an image.

In many applications, it is desired to detect spectral content of the incident electro-magnetic radiation. Thus, the acquired image should provide information of amounts of electro-magnetic radiation that may be assigned to specific narrow ranges of wavelengths of electro-magnetic radiation. In this regard, separate filters may be arranged over different photo-sensitive areas 12 such that only a narrow range of wavelengths of electro-magnetic radiation is allowed to pass to each photo-sensitive area 12. Each photo-sensitive area 12 may thus detect a specific narrow range of wavelengths of electro-magnetic radiation.

As shown in FIG. 1, the integrated circuit 10 according to a first embodiment of the disclosed technology includes a first multi-layer structure 14 arranged in a first region over a plurality of photo-sensitive areas 12*a-c*. The first multi-layer structure 14 includes a bottom reflective structure 16, a spacer layer 18 and a top reflective structure 20.

The bottom reflective structure 16 and the top reflective structure 20 are arranged to provide reflective structures on opposite sides of the spacer layer 18. This implies that electro-magnetic radiation will be reflected multiple times in the reflective structures on opposite sides of the spacer layer 18. Constructive interference between different reflections of the electro-magnetic radiation may be created for a specific wavelength. Thus, the refractive index and thickness of the spacer layer 18 may control a narrow range of wavelengths of electro-magnetic radiation which will be allowed to pass the first multi-layer structure 14 and the first multi-layer structure 14 may thus form a Fabry-Pérot filter.

The thickness of the spacer layer 18 of the first multi-layer structure 14 may differ over different photo-sensitive areas 12*a-c*. Thus, different wavelengths will be allowed to pass to the different photo-sensitive areas 12*a-c*.

The bottom and top reflective structures 16, 20 each include a stack of alternating layers 16*a*, 16*b*; 20*a*, 20*b* of a first and a second material. The top and bottom reflective structures 16, 20 within the first multi-layer structure 14 may be formed from the same first and second materials and having alternating layers of the same thickness. However, it should be realized that the top and bottom reflective structures 16, 20 may differ, e.g. by means of having different numbers of alternating layers. For brevity, only the bottom reflective structure 16 will be discussed below and it should be realized that the top reflective structure 20 may thus be similarly formed.

One of the first and second materials of the alternating layers 16*a*, 16*b* of the bottom reflective structure 16 may have a relatively low refractive index and the other of the first and second materials may have a relatively high refractive index. The thicknesses of the layers 16*a*, 16*b* may be designed such that a path-length difference for reflections from different high-index layers are integer multiples of a wavelength of the electro-magnetic radiation for which the first multi-layer structure 14 is designed. Reflections from different low-index layers have exactly half a wavelength in path-length difference, but there is a 180° difference in phase shift at an interface from a low-index layer to a high-index layer, compared to at an interface from a high-index layer to a low-index layer, which means that these reflections are also in phase.

The bottom reflective structure 16 will be reflective for a range of wavelengths around a central wavelength $\lambda_0$ for which the bottom reflective structure 16 is designed. A width $\Delta\lambda_0$ of the range of wavelengths for which the bottom reflective structure 16 is reflective is given by:

$$\Delta\lambda_0 = \frac{4\lambda_0}{\pi}\arcsin\left(\frac{n_2 - n_1}{n_2 + n_1}\right)$$

where $n_1$ is the refractive index of the material having a relatively low refractive index and $n_2$ is the refractive index of the material having a relatively high refractive index. As can be seen, a large difference between the refractive indices of the first and second materials means that the width of the range of wavelengths for which the bottom reflective structure 16 is large. Hence, it would be desirable that there is a large difference in refractive indices of the first and second materials.

The first and second materials may be chosen to provide a large difference in refractive indices. A choice of the first and second materials may also be based on a low absorbance of the wavelengths that are to be passed to the photo-sensitive area 12.

As shown in FIG. 1, the integrated circuit 10 according to a first embodiment of the disclosed technology also includes a second multi-layer structure 22 arranged in a second region over a plurality of photo-sensitive areas 12*e-g*. Similarly to the first multi-layer structure 14, the second multi-layer structure 22 includes a bottom reflective structure 24, a spacer layer 26 and a top reflective structure 28. The thickness of the spacer layer 26 may also differ over different photo-sensitive areas 12*e-g*, so that different wavelengths will be allowed to pass to the different photo-sensitive areas 12*e-g*.

As discussed above, there are requirements regarding refractive indices and absorbance of the first and second materials that need to be considered in order to provide filters over photo-sensitive areas 12. Thus, according to the first embodiment of the disclosed technology, a first multi-layer structure 14 and a second multi-layer structure 22 are separately formed over a first and a second region of the photo-sensitive areas 12 to form filters adapted for different ranges of wavelengths of the electro-magnetic radiation.

According to an embodiment, the first and second materials may be chosen from materials compatible with a semiconductor manufacturing process and preferably from common materials used in such process. This implies that the forming of the first and second multi-layer structures 14, 22 may be included in normal manufacturing of the integrated circuit.

The first and second multi-layer structures 14, 22 may be formed from different set-ups of first and second materials and/or thicknesses of the alternating layers so as to provide filters for different ranges of wavelengths over the array of photo-sensitive areas 12. Thus, images acquired by means of the integrated circuit 10 may provide spectral information over a broad range of wavelengths.

Referring now to FIGS. 2A, 2B, 2C and 2D, a method for forming the first and second multi-layer structures 14, 22 on a substrate comprising the photo-sensitive areas 12 will be described.

First, a first multi-layer structure 14 may be formed by depositing the bottom reflective structure 16, the spacer layer 18 and the top reflective structure 20 on top of each other. The spacer layer 18 may be deposited in a number of masked steps, such that a desired thickness of the spacer layer 18 may be formed over each of the photo-sensitive areas 12*a-c*.

A cap layer 30 may be formed on top of the first multi-layer structure 14. The cap layer 30 may be formed of a material compatible with a semiconductor manufacturing process and may be arranged to protect the under-lying first multi-layer structure 14 from improperly being affected by subsequent steps for selectively removing structures. Such removal is below described as etching steps, but it should be realized that selective removal of layers may be performed in other ways as well, such as by lift-off of a sacrificial layer.

Figure 2A:
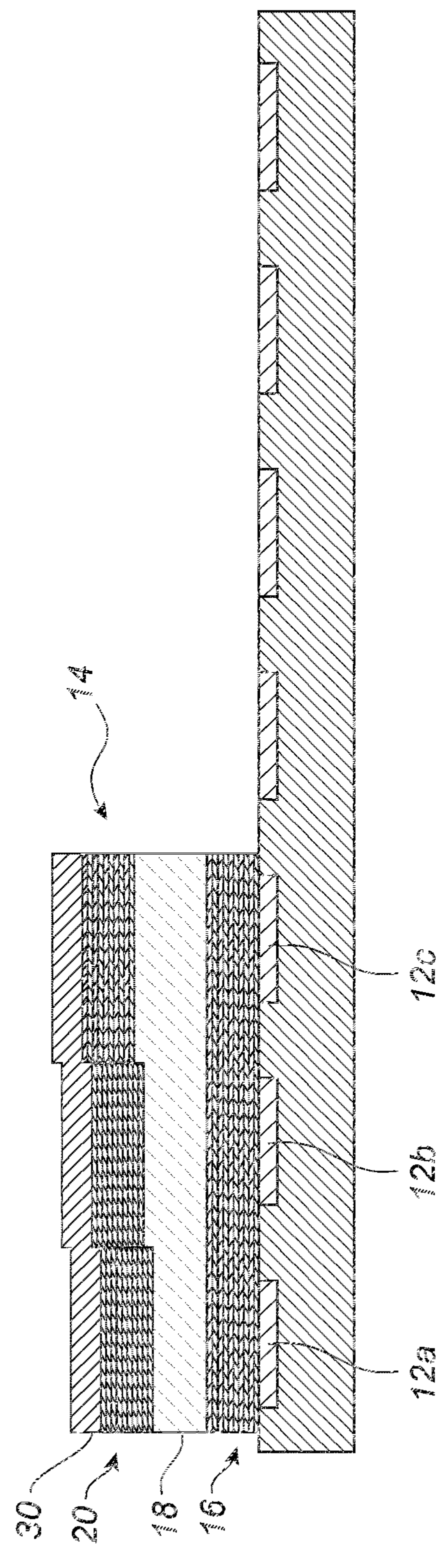
FIG. 2A is a schematic view of the integrated circuit according to the first embodiment during an intermediate stage of forming the integrated circuit.

The first multi-layer structure 14 may then be patterned so that the first multi-layer structure 14 is only left over the photo-sensitive areas 12*a-c* as illustrated in FIG. 2A. In an alternative, the cap layer 30 may be formed on top of the first multi-layer structure 14 after patterning of the first multi-layer structure 14.

Figure 2B:
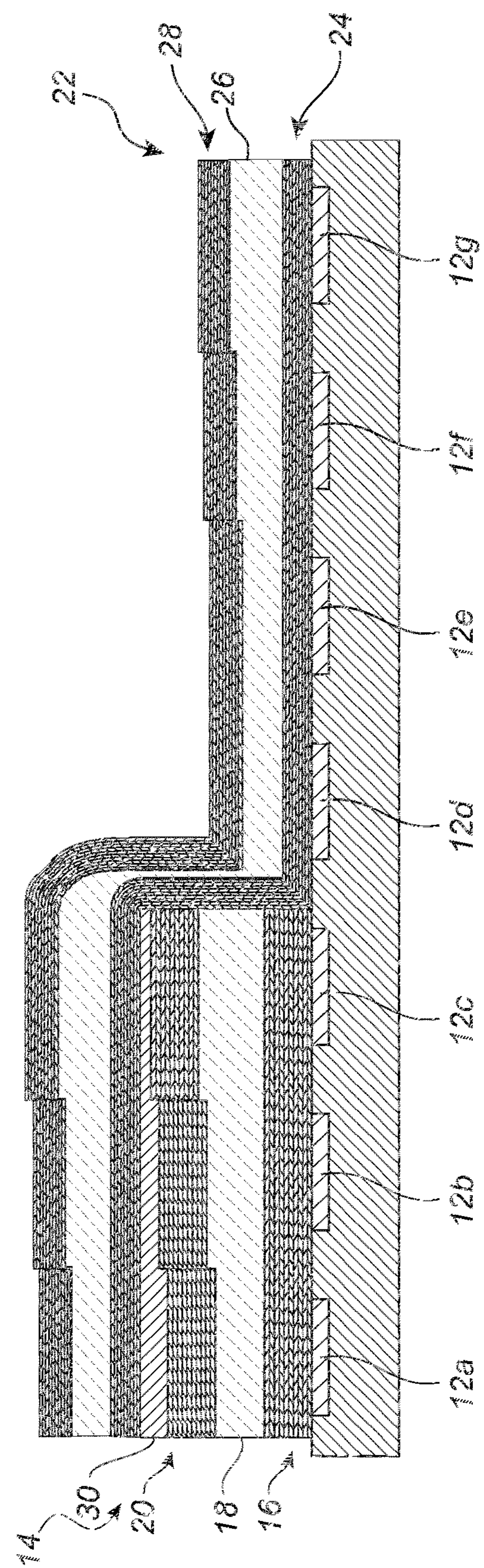
FIG. 2B is a schematic view of the integrated circuit according to the first embodiment during an intermediate stage of forming the integrated circuit.

Then, the second multi-layer structure 22 may be formed by depositing the bottom reflective structure 24, the spacer layer 26 and the top reflective structure 28 on top of each other. The second multi-layer structure 22 is thus formed on top of the first multi-layer structure 14 as well as over the other photo-sensitive areas 12*e-g*, as illustrated in FIG. 2B.

Figure 2C:
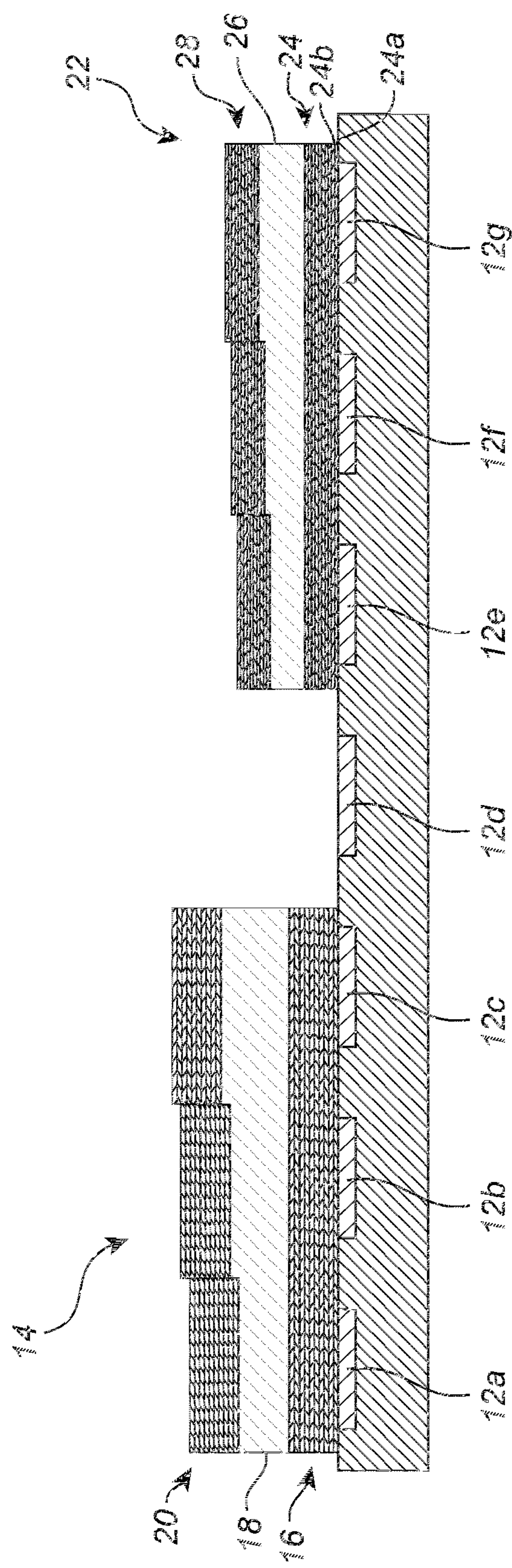
FIG. 2C is a schematic view of the integrated circuit according to the first embodiment during an intermediate stage of forming the integrated circuit.

The second multi-layer structure 22 is then patterned by selectively etching the second multi-layer structure 22 from undesired parts of the substrate. The cap layer 30 may thus serve as a stop to the etching performed over the first multi-layer structure 14 such that the first multi-layer structure 14 is not affected by the patterning of the second multi-layer structure 22. Thus, an integrated circuit is formed, as illustrated in FIG. 2C, wherein a first multi-layer structure 14 is formed over a first region of photo-sensitive areas 12*a-c* and a second multi-layer structure 22 is formed over a second region of photo-sensitive areas 12*e-g*. The cap layer 30 may thereafter be selectively removed. However, if the optical properties of the cap layer 30 allow, the cap layer 30 may be left on top of the first multi-layer structure 14 since it will not then affect the filter properties of the first multi-layer structure 14.

Figure 2D:
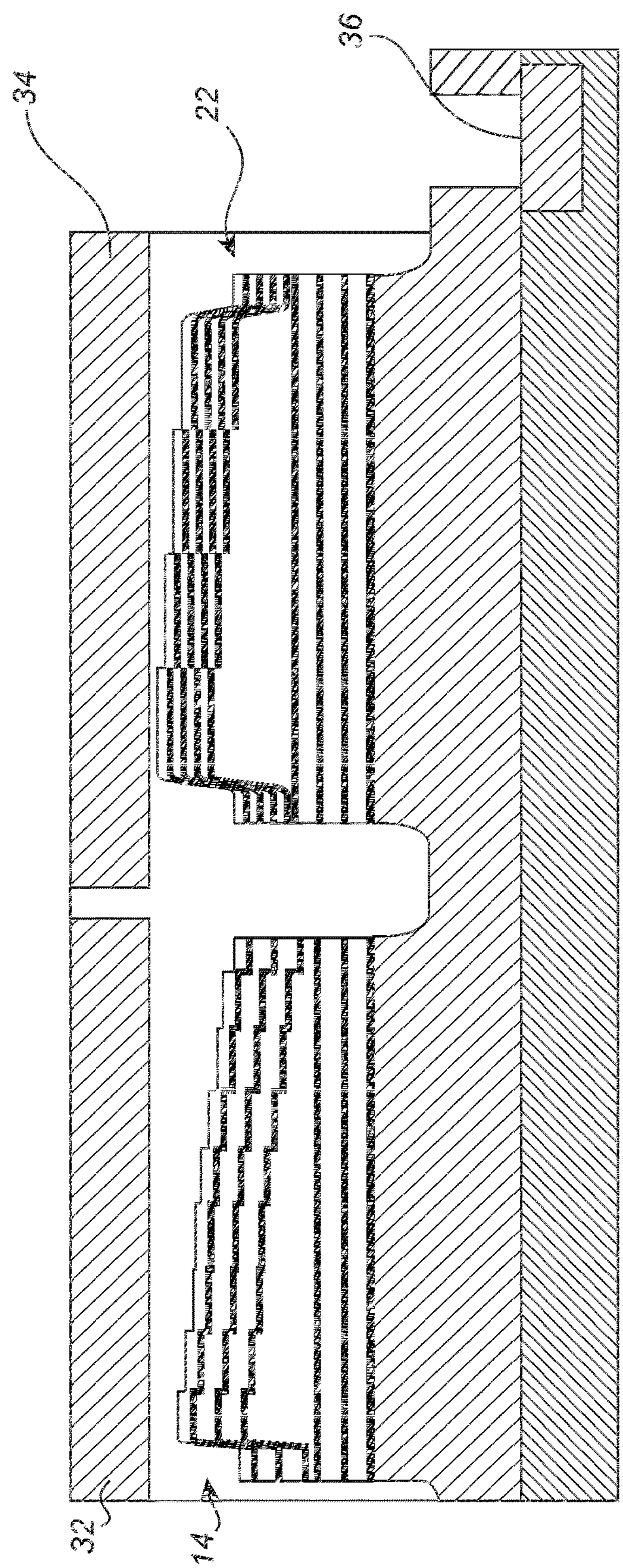
FIG. 2D is a schematic view of the integrated circuit according to the first embodiment during an intermediate stage of forming the integrated circuit.

As shown in FIG. 2D, a first wavelength-rejecting filter 32 may then be deposited on top of the first multi-layer structure 14 and a second wavelength-rejecting filter 34 may be deposited on top of the second multi-layer structure 14. The first and second wavelength-rejecting filters 32, 34 may be arranged to respectively prevent undesired wavelengths to reach the first and second multi-layer structures 14, 22 below. In particular, the reflective structures 16, 20 of the first multi-layer structure 14 and the reflective structures 24, 28 of the second multi-layer structure 22 may transmit wavelengths for which the filter has not been designed. Thus, the first and second wavelength-rejecting filters 32, 34 may prevent such wavelengths to reach the first and second multi-layer structures 14, 22, respectively. Since the first and second multi-layer structures 14, 22 are arranged to pass different ranges of wavelengths to the photo-sensitive areas 12, different wavelength-rejecting filters 32, 34 may need to be arranged on top of the respective multi-layer structures 14, 22.

As also illustrated in FIG. 2D, further steps in the manufacturing of the integrated circuit 10 may be performed after the first and second multi-layer structures 14, 22 have been formed. For instance, opening of a bond pad 36 may be performed.

According to an alternative method for forming the first and second multi-layer structures 14, 22 of the first embodiment, the bottom reflective structure 16 of the first multi-layer structure 14 is first patterned and then the cap layer 30 is formed on the bottom reflective structure 16. Thereafter, the bottom reflective structure 24 of the second multi-layer structure 22 is deposited. Then, patterning of the bottom reflective structure 24 of the second multi-layer structure 22 may be performed, wherein the cap layer 30 serves as a stop to prevent the bottom reflective structure 16 of the first multi-layer structure 14 to be affected by etching. Then, the spacer layers 18 and 26 of the first and second multi-layer structures 14, 22 may be sequentially formed, before the top reflective structures 20, 28 of the first and second multi-layer structures 14, 22 are formed. Again, cap layers are deposited to protect the first and second multi-layer structures 14, 22, respectively, to be affected by etching steps during patterning of the top reflective structures 20, 28 of the first and second multi-layer structures 14, 22.

It should be realized that many combinations can be chosen for an order in which components of the first and second multi-layer structures 14, 22 are processed. A choice may depend on processing compatibility of materials of the multi-layer structures 14, 22, temperature budget, etch selectivity and cap layer selection.

Referring now to FIGS. 3A, 3B, 3C and 3D, a method for forming the first and second multi-layer structures 14, 22 on a substrate comprising the photo-sensitive areas 12 according to a second embodiment of the disclosed technology will be described.

According to the second embodiment of the disclosed technology, the first and second multi-layer structures 14, 22 are formed layer by layer in parallel. This may be performed by means of the bottom and top reflective structures 16, 20 of the first multi-layer structure 14 being formed by the same first and second materials as the bottom and top reflective structures 24, 28 of the second multi-layer structure 22.

Figure 3A:
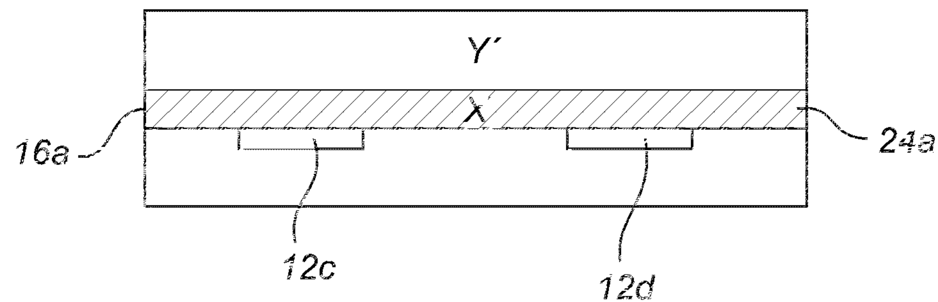
FIG. 3A is a schematic view of the integrated circuit according to a second embodiment during an intermediate stage of forming the integrated circuit.

As shown in FIG. 3A, a first material of thickness X may be deposited in a first region over a first photo-sensitive area 12*c*, over which the first multi-layer structure 14 is to be formed and in a second region over a second photo-sensitive area 12*d*, over which the second multi-layer structure 22 is to be formed. Thus, a first layer 16*a*, 24*a* of a first material is formed in both the first and second regions.

Figure 3B:
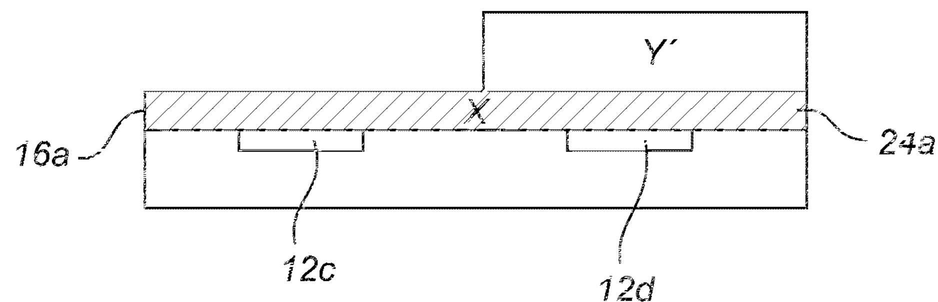
FIG. 3B is a schematic view of the integrated circuit according to a second embodiment during an intermediate stage of forming the integrated circuit.
Figure 3C:
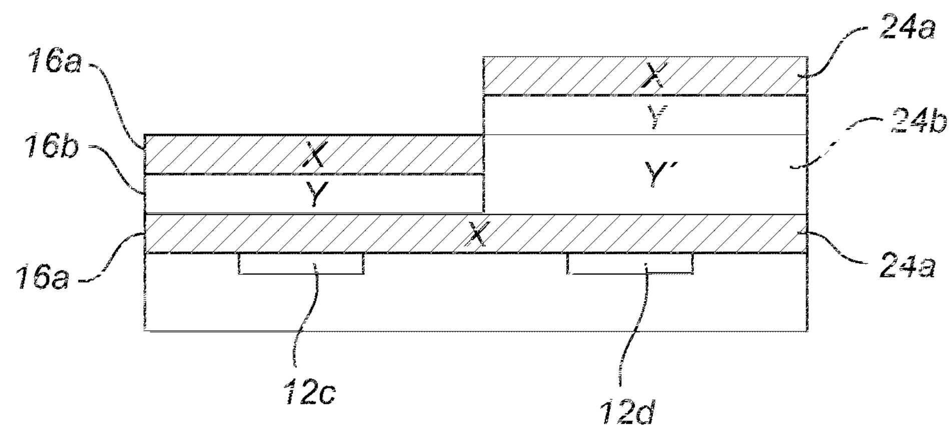
FIG. 3C is a schematic view of the integrated circuit according to a second embodiment during an intermediate stage of forming the integrated circuit.

Then, a second material of thickness Y' is also deposited in the first and the second regions, as also shown in FIG. 3A. The second material may then be completely removed from the first region by selective etching of the second material in the first region, as illustrated in FIG. 3B. This may be followed by a second deposition of the second material of a thickness Y. As illustrated in FIG. 3C, this implies that a layer 24*b* of the second material having thickness Y+Y' is formed in the second region, whereas a layer 16*b* of the second material having thickness Y is formed in the first region.

According to an alternative, the etching of the second material in the first region may be carefully controlled such that the thickness of the layer 16*b* of the second material is determined by the deposition of the second material and the partial removal of the second material during etching.

Figure 3D:
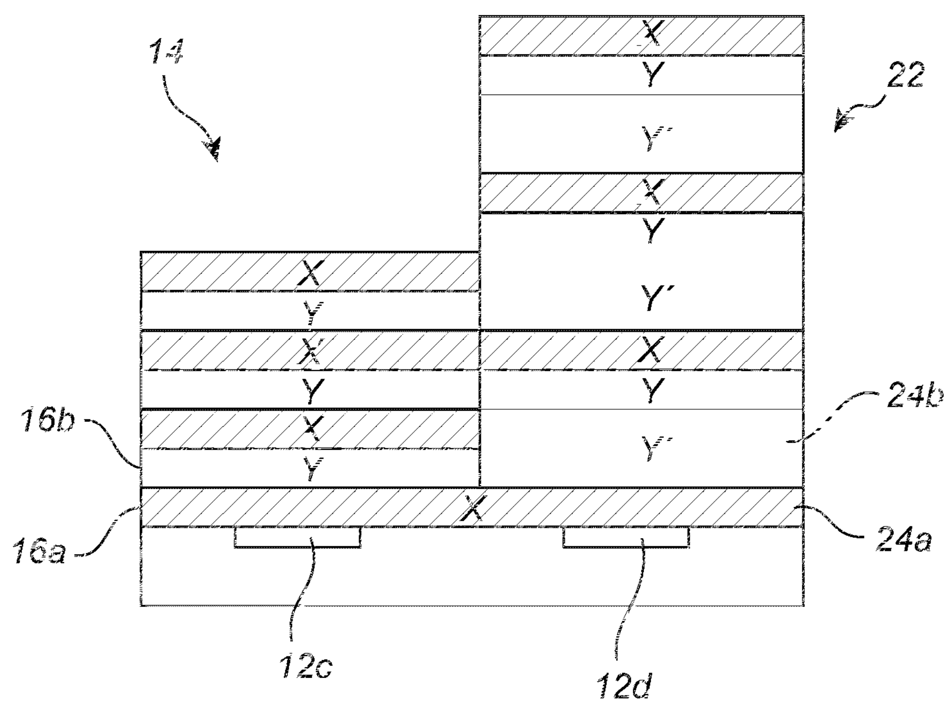
FIG. 3D is a schematic view of the integrated circuit according to a second embodiment during an intermediate stage of forming the integrated circuit.

Then, a second layer 16*a*, 24*a* of the first material may again be formed in both the first and second regions, as shown in FIG. 3C. Thus, the above-described process may be repeated in several steps of depositing alternating layers of the first and second materials to form first and second multi-layer structures 14, 22 in close relation to each other, as shown in FIG. 3D.

The spacer layers 18, 26 may then be formed on the first and second multi-layer structures 14, 22, respectively, and then the top reflective structures 20, 28 may be formed in similar manner as described above for the bottom reflective structures 16, 24.

The first and second multi-layer structures 14, 22 may include a large number of layers and may be relatively thick, e.g., on the order of 1-3 μm. It may therefore be difficult to achieve patterning of the entire structure, as described for the first embodiment of the disclosed technology, and still be able to arrange the first and second multi-layer structures 14, 22 close to each other. However, with the layer by layer forming of the first and second multi-layer structures, as described for the second embodiment of the disclosed technology, the first and second multi-layer structures 14, 22 may be formed closer to each other. It may be possible to form the first and second multi-layer structures 14, 22 with a spacing of, for example, 100-500 nm from each other. This also implies that the first and second multi-layer structures 14, 22 may be formed over adjacent pixels and therefore that all pixels of the array may be used.

Referring now to FIGS. 4A, 4B, 4C, 4D and 4E, a method for forming first, second, and third multi-layer structures 14, 22, 40 according to a third embodiment of the disclosed technology will be explained. This method expands the method described with reference to FIGS. 3A-3D above to a third region.

Now, the first, second and third multi-layer structures 14, 22, 40 are formed layer by layer in parallel. This may be performed by means of the bottom and top reflective structures of all three multi-layer structures 14, 22, 40 being formed by the same first and second materials.

Figure 4A:
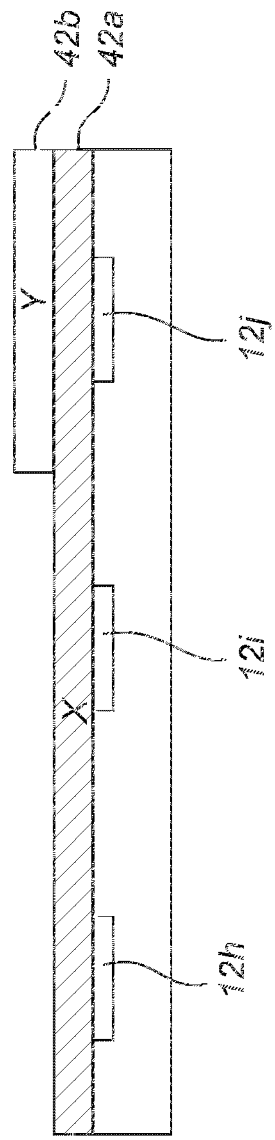
FIG. 4A is a schematic view of the integrated circuit according to a third embodiment during an intermediate stage of forming the integrated circuit.

As shown in FIG. 4A, a first material of thickness X may be deposited in a first region over a first photo-sensitive area 12*h*, over which the first multi-layer structure 14 is to be formed, in a second region over a second photo-sensitive area 12*i*, over which the second multi-layer structure 22 is to be formed, and in a third region over a third photo-sensitive area 12*j*, over which the third multi-layer structure 40 is to be formed.

Then, a second material of thickness Y is deposited in the first, second, and third regions and is selectively removed from the first and second regions, as also shown in FIG. 4A. This layer of second material will be referred to below as an intermediate layer, since it is completely removed from the first and second multi-layer structures 14, 22.

Figure 4B:
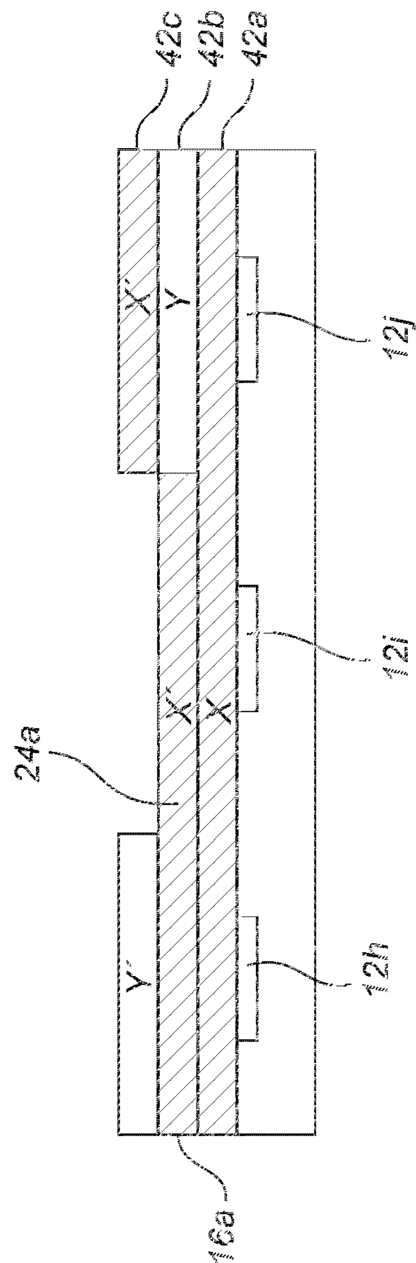
FIG. 4B is a schematic view of the integrated circuit according to a third embodiment during an intermediate stage of forming the integrated circuit.

Thereafter, a thickness X' of the first material is deposited in the first, second, and third regions. Thus, as shown in FIG. 4B, first layers 16*a*, 24*a* having thickness X+X' are formed in both the first and second regions. In the third region, however, a first layer 42*a* having thickness X has been formed and on top of the first layer 42*a*, a second, intermediate layer 42*b* of the second material having thickness Y has been formed and a third layer 42*c* of the first material having thickness X' has been formed.

Then, a thickness Y' of the second material is deposited in the first, second, and third regions. The second material is then selectively etched from the second and third regions, leaving only a layer of thickness Y' in the first region, as shown in FIG. 4B.

Figure 4C:
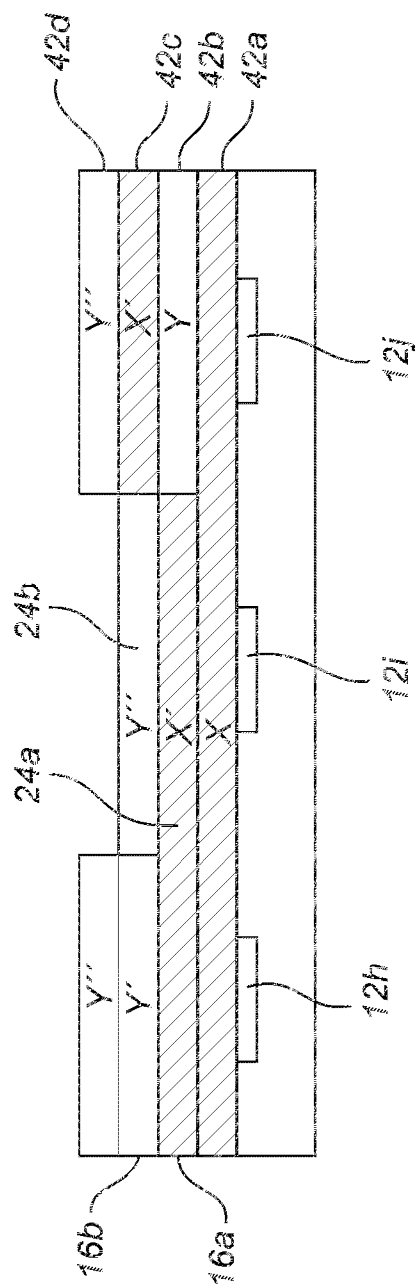
FIG. 4C is a schematic view of the integrated circuit according to a third embodiment during an intermediate stage of forming the integrated circuit.

Thereafter, a thickness Y" of the second material is deposited in the first, second, and third regions. Thus, as shown in FIG. 4C, a second layer 16*b* having thickness Y'+Y" is formed in the first region, whereas a second layer 24*b* having thickness Y" is formed in the second region. In the third region, a fourth layer 42*d* having thickness Y" is formed.

Figure 4D:
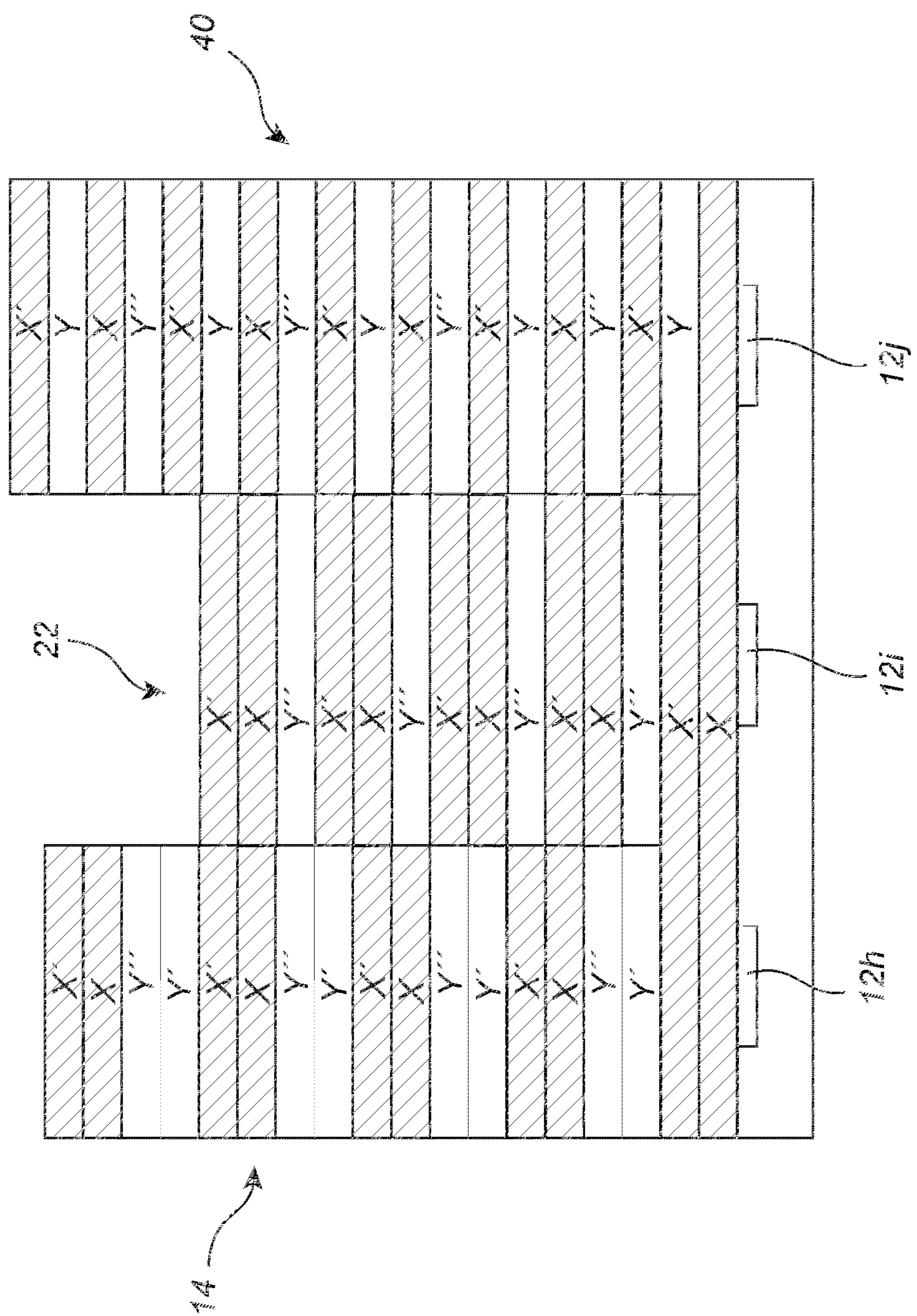
FIG. 4D is a schematic view of the integrated circuit according to a third embodiment during an intermediate stage of forming the integrated circuit.

The above-described process may be repeated in several steps of depositing alternating layers of the first and second materials to form first, second, and third multi-layer structures 14, 22 in close relation to each other, as shown in FIG. 4D. As is clear from FIG. 4D, the first and second multi-layer structures 14, 22 have layers 16*a*, 24*a* of the first material having the same thickness and layers 16*b*, 24*b* having different thicknesses. The third multi-layer structure 40 includes double numbers of layers in comparison to the first and second multi-layer structures 14, 22.

Figure 4E:
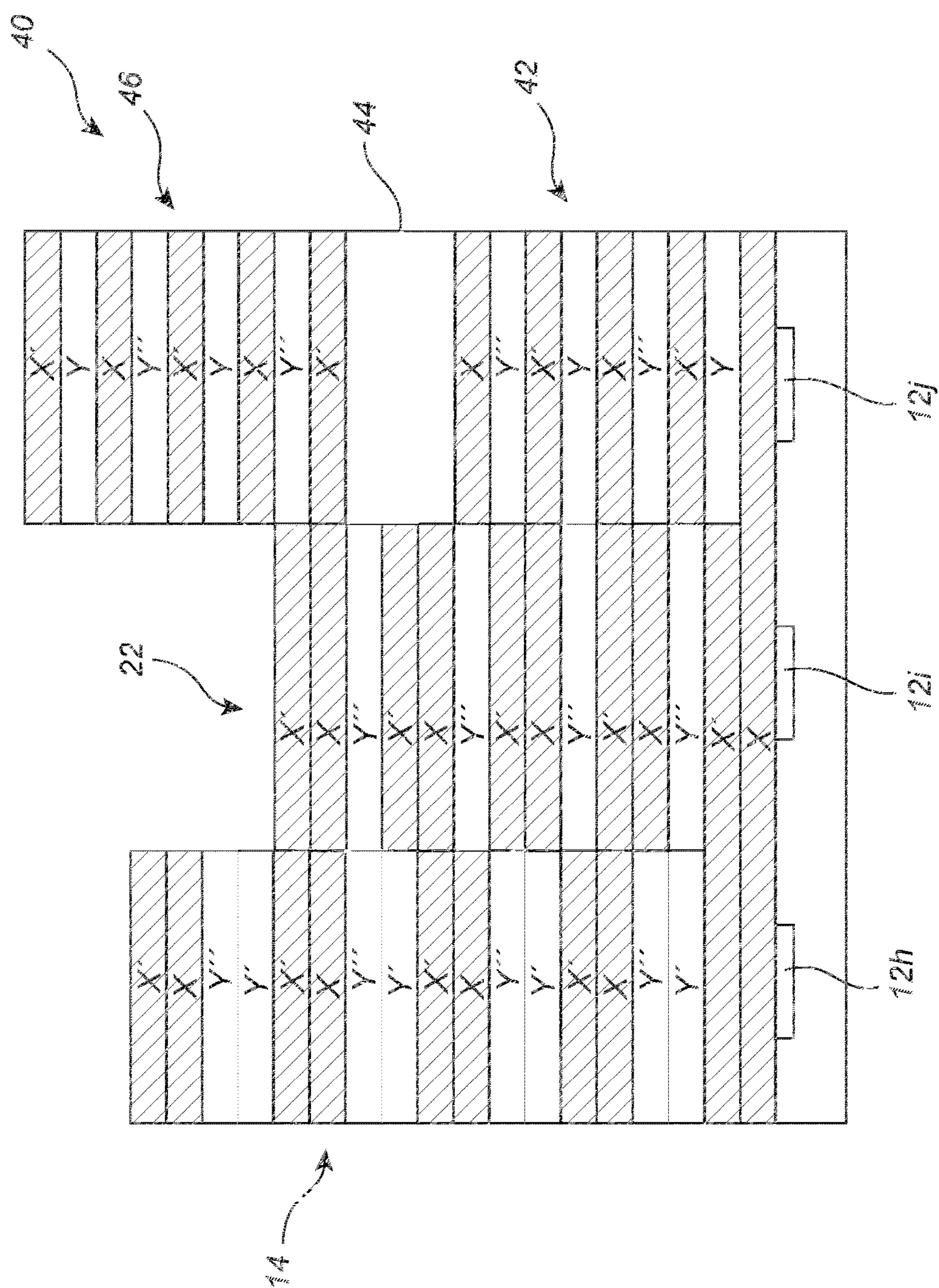
FIG. 4E is a schematic view of the integrated circuit according to a third embodiment during an intermediate stags of forming the integrated circuit.

Since the third multi-layer structure 40 includes intermediate layers 42*b*, which are completely removed from the first and second multi-layer structures 14, 22, a spacer layer 44 may be formed by deposition of an intermediate layer, as illustrated in FIG. 4Ee. Thus, a complete third multi-layer structure 40 comprising a bottom reflective structure 42, a spacer layer 44 and a top reflective structure 46 may be formed in parallel with forming of the bottom reflective structures 16, 24 or top reflective structures 20, 28 of the first and second multi-layer structures 14, 22.

According to one alternative, the bottom reflective structures 16, 24 and the spacer layers 18, 26 of the first and second multi-layer structures 14, 22 may first be formed. Thereafter, an etching step may be performed to remove deposited material from the third region. Then, the procedure described above with reference to FIGS. 4A-4E may be performed to form the top reflective structures 20, 28 of the first and second multi-layer structures 14, 22 in parallel with the forming of the complete third multi-layer structure 40.

Figure 5:
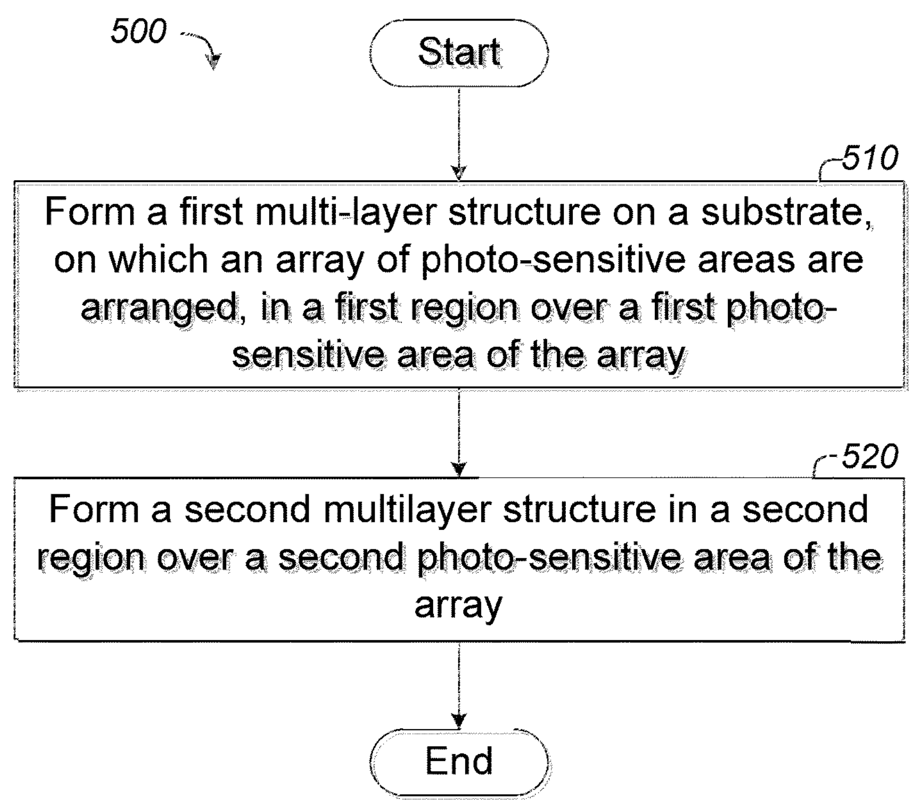
FIG. 5 is a flowchart of a method of method of manufacturing an integrated circuit for an imaging device according to an embodiment of the disclosed technology.

FIG. 5 is a flowchart illustrating an embodiment of a method 500 of manufacturing an integrated circuit for an imaging device according to the disclosed technology. In block 510, method 500 forms a first multi-layer structure on a substrate, on which an array of photo-sensitive areas are arranged. The first multi-layer structure is formed in a first region over a first photo-sensitive area of the array. The first multi-layer structure includes a bottom reflective structure, a top reflective structure and a spacer layer arranged between the bottom and top reflective structures. The spacer layer has a thickness which is adapted so that the first multi-layer structure selectively transmits a narrow range of wavelengths of electro-magnetic radiation. At least one of the bottom and top reflective structures comprise a stack of alternating layers of a first and a second material for forming a reflective structure.

In block 520, method 500 forms a second multi-layer structure in a second region over a second photo-sensitive area of the array. The second multi-layer structure includes a bottom reflective structure, a top reflective structure and a spacer layer arranged between the bottom and top reflective structures. The spacer layer has a thickness which is adapted so that the second multi-layer structure selectively transmits a narrow range of wavelengths of electro-magnetic radiation. At least one of the bottom and top reflective structures include a stack of alternating layers of a first and a second material for forming a reflective structure. Thickness and/or material of the alternating layers of the at least one of the bottom and top reflective structures of the first multi-layer structure differ from thickness and/or material of the alternating layers of the at least one of the bottom and top reflective structures of the second multi-layer structure.

In the above the disclosed technology has mainly been described with reference to a limited number of embodiments. However, as is readily appreciated by a person skilled in the art, other embodiments than the ones disclosed above are equally possible within the scope of the disclosed technology, as defined by the appended claims.

For instance, it should be realized that the multi-layer structures may be arranged over any number of photo-sensitive areas, such as a single photo-sensitive area or a large number of photo-sensitive areas. Thus, even though the multi-layer structures in the second and third embodiments are shown as arranged over only a single photo-sensitive area, the multi-layer structures may be arranged over a plurality of photo-sensitive areas. However, the multi-layer structures may also, or alternatively, be formed in an alternating manner such that several regions of each of the multi-layer structures may be formed over the array of photo-sensitive areas.

Those skilled in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those skilled in the art will further appreciate that the various illustrative logical blocks, modules, circuits, methods and algorithms described in connection with the examples disclosed herein may be implemented as electronic hardware, computer software, or combinations of both. To clearly illustrate this interchangeability of hardware and software, various illustrative components, blocks, modules, circuits, methods and algorithms have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be connected to the processor such that the processor can read information from, and write information to, the storage medium. In the alternative, the storage medium may be integral to the processor. The processor and the storage medium may reside in an ASIC.

Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently, rather than sequentially.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. As will be recognized, certain embodiments of the inventions described herein can be embodied within a form that does not provide all of the features and benefits set forth herein, as some features can be used or practiced separately from others. The scope of certain inventions disclosed herein is indicated by the appended claims rather than by the foregoing description. All changes which come within the meaning and range of equivalency of the claims are to be embraced within their scope. Thus, the present invention is not intended to be limited to the examples shown herein but is to be accorded the widest scope consistent with the principles and novel features disclosed herein.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

What is claimed is:

1. A method of manufacturing an integrated circuit for an imaging device, comprising:

forming a first multi-layer structure on a substrate, on which an array of photo-sensitive areas are arranged, wherein the first multi-layer structure is formed in a first region over a first photo-sensitive area of the array, wherein the first multi-layer structure comprises a bottom reflective structure, a top reflective structure and a spacer layer arranged between the bottom and top reflective structures, the spacer layer having a thickness which is adapted so that the first multi-layer structure selectively transmits a narrow range of wavelengths of electro-magnetic radiation, wherein at least one of the bottom and top reflective structures comprise a stack of alternating layers of a first and a second material for forming a reflective structure; and forming a second multi-layer structure in a second region over a second photo-sensitive area of the array, wherein the second multi-layer structure comprises a bottom reflective structure, a top reflective structure and a spacer layer arranged between the bottom and top reflective structures, the spacer layer having a thickness which is adapted so that the second multi-layer structure selectively transmits a narrow range of wavelengths of electro-magnetic radiation, wherein at least one of the bottom and top reflective structures comprise a stack of alternating layers of a first and a second material for forming a reflective structure, wherein thickness and/or material of the alternating layers of the at least one of the bottom and top reflective structures of the first multi-layer structure differ from thickness and/or material of the alternating layers of the at least one of the bottom and top reflective structures of the second multi-layer structure;

wherein forming the first and second multi-layer structures comprises:

depositing at least the bottom reflective structure of the first multi-layer structure over the first photo-sensitive area;

depositing a cap layer on the at least bottom reflective structure of the first multi-layer structure, depositing at least the bottom reflective structure of the second multi-layer structure over the second photo-sensitive area and on top of the at least bottom reflective structure of the first multi-layer structure over the first photo-sensitive area; and selectively removing the at least bottom reflective structure of the second structure from over the first photo-sensitive area.

2. The method of claim 1, wherein the first multi-layer structure is arranged over a plurality of photo-sensitive areas of the array, and wherein a thickness of the spacer layer of the first multi-layer structure is different over different photo-sensitive areas of the plurality of photo-sensitive areas.

3. The method of claim 1, further comprising forming a first wavelength-rejecting filter arranged over the first multi-layer structure and a second wavelength-rejecting filter arranged over the second multi-layer structure to prevent undesired wavelengths of electro-magnetic radiation to reach the photo-sensitive areas.

4. The method of claim 1, wherein the stack of the first multi-layer structure and the stack of the second multi-layer structure comprises the same first and second materials; and wherein layers of the second material in the stack of the first multi-layer structure is of a different thickness than layers of the second material in the stack of the second multi-layer structure.

5. The method of claim 4, wherein layers of the first material in the stack of the first multi-layer structure has the same thickness as layers of the first material in the stack of the second multi-layer structure.

6. The method of claim 1, wherein one of the first and second materials has a relatively low refractive index and another of the first and second materials has a relatively high refractive index.

7. The method of claim 1, wherein the bottom reflective structure, the spacer layer and the top reflective structure of the first multi-layer structure are deposited over the first photo-sensitive area before depositing the cap layer.

8. The method of claim 7, further comprising:

forming a third multi-layer structure in a third region over a third photo-sensitive area of the array; wherein the first material is deposited also in the third region;

depositing an intermediate layer of the second material in the first region, the second region, and the third region;

selectively removing the second material from the first and second regions; and depositing the first material in the first, second, and third region.

9. The method of claim 8, wherein the depositing of an intermediate layer is controlled to form a spacer layer in the third multi-layer structure.

10. The method of claim 1, further comprising:

forming the first multi-layer structure over a plurality of photo-sensitive areas of the array; and selectively depositing and/or removing the spacer layer, of the first multi-layer structure, in different portions of the first multi-layer structure over different photo-sensitive areas such that the thickness of the spacer layer in the first multi-layer structure is different over different photo-sensitive areas of the plurality of photo-sensitive areas.

11. The method of claim 1, further comprising:

forming a third multi-layer structure in a third region over a third photo-sensitive area of the array; wherein the first material is deposited also in the third region;

depositing an intermediate layer of the second material in the first region, the second region, and the third region;

selectively removing the second material from the first and second regions; and depositing the first material in the first, second, and third region.

12. The method of claim 11, wherein the depositing of an intermediate layer is controlled to form a spacer layer in the third multi-layer structure.

13. The method of claim 7, further comprising:

forming the first multi-layer structure over a plurality of photo-sensitive areas of the array; and selectively depositing and/or removing the spacer layer, of the first multi-layer structure, in different portions of the first multi-layer structure over different photo-sensitive areas such that the thickness of the spacer layer in the first multi-layer structure is different over different photo-sensitive areas of the plurality of photo-sensitive areas.

14. The method of claim 7, wherein the first multi-layer structure is arranged over a plurality of photo-sensitive areas of the array, and wherein a thickness of the spacer layer of the first multi-layer structure is different over different photo-sensitive areas of the plurality of photo-sensitive areas.

15. The method of claim 7, further comprising forming a first wavelength-rejecting filter arranged over the first multi-layer structure and a second wavelength-rejecting filter arranged over the second multi-layer structure to prevent undesired wavelengths of electro-magnetic radiation to reach the photo-sensitive areas.

16. The method of claim 7, wherein the stack of the first multi-layer structure and the stack of the second multi-layer structure comprises the same first and second materials; and wherein layers of the second material in the stack of the first multi-layer structure is of a different thickness than layers of the second material in the stack of the second multi-layer structure.

17. The method of claim 16, wherein layers of the first material in the stack of the first multi-layer structure has the same thickness as layers of the first material in the stack of the second multi-layer structure.

18. The method of claim 7, wherein one of the first and second materials has a relatively low refractive index and another of the first and second materials has a relatively high refractive index.

19. The method of claim 2, further comprising forming a first wavelength-rejecting filter arranged over the first multi-layer structure and a second wavelength-rejecting filter arranged over the second multi-layer structure to prevent undesired wavelengths of electro-magnetic radiation to reach the photo-sensitive areas.

20. The method of claim 2, wherein the stack of the first multi-layer structure and the stack of the second multi-layer structure comprises the same first and second materials; and wherein layers of the second material in the stack of the first multi-layer structure is of a different thickness than layers of the second material in the stack of the second multi-layer structure.

* * * * *